(12) United States Patent
Lee et al.

(10) Patent No.: US 7,508,654 B2
(45) Date of Patent: Mar. 24, 2009

(54) DISPLAY APPARATUS AND METHOD

(75) Inventors: You-sub Lee, Kunpo (KR); Eun-serb An, Suwon (KR); Kwey-hyun Kim, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 685 days.

(21) Appl. No.: 10/910,774

(22) Filed: Aug. 4, 2004

(65) Prior Publication Data

US 2005/0117283 A1   Jun. 2, 2005

(30) Foreign Application Priority Data

Aug. 4, 2003   (KR) ................ 10-2003-0053837
Aug. 4, 2003   (KR) ................ 10-2003-0053838

(51) Int. Cl.
H05K 7/00   (2006.01)

(52) U.S. Cl. .................. 361/681; 361/704; 349/58; 345/60; 315/85

(58) Field of Classification Search .......... 361/704, 361/681, 752; 349/58, 59, 150; 345/60; 362/330; 257/E23.088, E23.102; 348/E5.132, 348/E5.135, E5.128, 825, 836, 128; 315/85; 313/582

See application file for complete search history.

(56) References Cited

U.S. PATENT DOCUMENTS

| | | | | |
|---|---|---|---|---|
| 4,644,408 A * | 2/1987 | Coleman | ................ | 348/836 |
| 5,450,221 A * | 9/1995 | Owen et al. | ................ | 349/58 |
| 5,929,945 A * | 7/1999 | Negishi et al. | ............ | 348/825 |
| 5,934,772 A * | 8/1999 | Sung | .................... | 312/7.2 |
| 5,990,985 A * | 11/1999 | Kim | ...................... | 348/836 |
| 6,342,932 B1 * | 1/2002 | Terao et al. | ................ | 349/58 |
| 6,429,832 B1 * | 8/2002 | Harada et al. | .............. | 345/60 |
| 6,565,214 B1 * | 5/2003 | Shinobu | ................... | 353/74 |
| 6,587,166 B1 * | 7/2003 | Lee et al. | .................. | 349/58 |
| 6,593,979 B1 * | 7/2003 | Ha et al. | .................... | 349/58 |
| 6,734,926 B2 * | 5/2004 | Fan et al. | .................. | 349/58 |
| 6,774,872 B1 * | 8/2004 | Kawada et al. | ............. | 345/60 |
| 6,801,195 B2 * | 10/2004 | Yoshida | ................. | 345/204 |

(Continued)

FOREIGN PATENT DOCUMENTS

JP      11-15388      1/1999

(Continued)

OTHER PUBLICATIONS

Office Action issued Jun. 21, 2005 by Korean Intellectual Property Office.

*Primary Examiner*—Jayprakash N Gandhi
*Assistant Examiner*—Courtney L Smith
(74) *Attorney, Agent, or Firm*—Staas & Halsey LLP

(57) ABSTRACT

A display apparatus having a display module, to display a picture, includes a front casing positioned adjacent to a front and side of the display module, and a rear casing positioned in a rear of the display module and with a plurality of air slits, to dissipate heat generated in the display module. The front casing includes an insulator, to prevent the heat generated in the display module from being transferred exterior of the front casing. The display apparatus prevents heat from being transferred from a display module to the exterior of a front casing. Further, debris created while a screw is inserted does not fall toward the display module, thereby preventing the display module from a malfunction due to the fallen debris.

4 Claims, 5 Drawing Sheets

U.S. PATENT DOCUMENTS

| | | | |
|---|---|---|---|
| 6,946,798 B2 * | 9/2005 | Kawaguchi et al. | 315/85 |
| 7,030,546 B2 * | 4/2006 | Han et al. | 313/402 |
| 7,046,310 B2 * | 5/2006 | Lee | 348/836 |
| 7,184,117 B2 * | 2/2007 | Suzuki | 349/150 |
| 7,236,215 B2 * | 6/2007 | Okamoto et al. | 349/58 |
| 2001/0043290 A1 * | 11/2001 | Yamamto | 348/836 |
| 2003/0122995 A1 * | 7/2003 | Park et al. | 349/58 |
| 2004/0114372 A1 * | 6/2004 | Han et al. | 362/330 |
| 2005/0105012 A1 * | 5/2005 | Kim et al. | 349/58 |
| 2005/0105259 A1 * | 5/2005 | Lee et al. | 361/681 |
| 2006/0012962 A1 * | 1/2006 | Obata | 361/704 |
| 2006/0192730 A1 * | 8/2006 | Kim et al. | 345/60 |
| 2006/0197721 A1 * | 9/2006 | Mizuno et al. | 345/60 |
| 2006/0203143 A1 * | 9/2006 | Shin | 349/58 |
| 2007/0127197 A1 * | 6/2007 | Tae et al. | 361/681 |
| 2007/0133158 A1 * | 6/2007 | Oda et al. | 361/681 |

FOREIGN PATENT DOCUMENTS

| | | |
|---|---|---|
| JP | 2000-3137 | 1/2000 |
| JP | 2000-347578 | 12/2000 |
| JP | 2002-6754 | 1/2002 |
| KR | 1999-008321 | 3/1999 |
| KR | 20-167100 | 10/1999 |
| KR | 20-0299617 | 12/2002 |

* cited by examiner

DISPLAY APPARATUS AND METHOD

CROSS-REFERENCE TO RELATED APPLICATIONS

This application claims the benefit of Korean Patent Applications Nos. 2003-53838, filed Aug. 4, 2003, and 2003-53837, filed Aug. 4, 2003, in the Korean Intellectual Property Office, the disclosure of which is incorporated herein by reference.

BACKGROUND OF THE INVENTION

1. Field of the Invention

The present invention relates to a display apparatus, and more particularly, to a display apparatus structurally improved, and preventing heat generated in a display module from being transferred to a front casing.

2. Description of the Related Art

Generally, a display apparatus includes a television, a monitor for a computer, etc., and includes a display module to display a picture, and a casing to support the display module.

The display module displays a picture by using a CRT (Cathode Ray Tube), an LCD (Liquid Crystal Display), or an PDP (Plasma Display Panel), etc.

Hereinafter, a display module including a PDP, and a circuit board to drive the PDP, will be described.

As demand for such display apparatus increases, methods have been developed to shield components, or a user, from EMI (electromagnetic interference) generated in the display apparatus. Further, various display apparatuses improved in outer appearance including decorations have been proposed because of marketplace demands.

FIGS. 1 and 2 are partial, sectional views of a conventional display apparatus.

As shown in FIG. 1, a display apparatus 101 includes a display module 110 to display a picture, a front casing 120 provided in the front and sides of the display module 110, and a rear casing 130 provided in the rear of the display module 110 and attached to the front casing 120.

The display module 110 includes a PDP 113 to display a picture, and a circuit board 118 to drive the PDP 113. Further, an optical filter 140 is provided in front of the display module 110.

The front casing 120 includes a filter support 125 in a front thereof, to support the optical filter 140, and an attachment section 123, in a rear thereof, to which a screw 135 is inserted to attach the front casing 120 with the rear casing 130. The front casing 120 is made of material containing aluminum.

The rear casing 130 has a through hole 133, in a front thereof, through which the screw 135 passes, to attach the front casing 120 with the rear casing 130. Further, the rear casing 130 has a plurality of air slits 131, to dissipate heat generated in the display module 110.

The optical filter 140 is supported by the filter support 125 of the front casing 120 with a filter supporting bracket 145.

The filter supporting bracket 145 has a first part attached to a back of the front casing 120 with a screw, and a second part supporting an edge of the optical filter 140.

However, in the conventional display apparatus, the display module 110 is exposed to an upper side 120a of the front casing 120, so that air, heated by the display module 110, rises and remains near the upper side 120a, thereby heating the upper side 120a of the front casing 120.

Further, in the conventional display apparatus, debris may fall on the circuit board 118 during the process of inserting the screw 135 in the attachment section 123 of the front casing 120 through the through hole 133 of the rear casing 130, to attach the front casing 120 with the rear casing 130. A malfunction due to the fallen debris may occur in the circuit board 118.

As shown in FIG. 2, a conventional display apparatus includes a front casing 202 with a filter support 201, in front thereof. An optical filter 203 is provided to the rear of the filter support 201 to shield the EMI, and a filter supporting bracket 204 is attached to the front casing 202 with a screw 207, in the rear of the optical filter 203, to support the optical filter 203. A decorative member 205 is attached to a front side of the front casing 202. A rear casing 206 is attached to the rear of the front casing 202.

The decorative member 205 is separately added to the front of the existing front casing 202 to improve the outer appearance, and attached to the front casing 202 with a screw 208.

However, in the conventional display apparatus, even though its design is improved by the decorative member 205, a coupling means is required, such as the screws 207 and 208, to attach the filter supporting bracket 202 supporting the optical filter 203 and the decorative member 205 to the front casing 202, respectively. Thus, assembly is complicated and inefficient.

Further, since the number of components and the number of assembling processes are relatively increased, production costs are increased.

SUMMARY OF THE INVENTION

Accordingly, it is an aspect of the present invention to provide a display apparatus to prevent heat from being transferred from a display module to the exterior of a front casing.

It is another aspect of the present invention to provide a display apparatus, to decrease the probability of malfunction.

It is still another aspect of the present invention to provide a display apparatus having a decorative member supporting an optical filter, in addition to improving the outward appearance of the apparatus.

The foregoing and/or other aspects of the present invention are achieved by providing a display apparatus having a display module to display a picture including a front casing adjacent to a front and side of the display module and a rear casing in the rear of the display module having a plurality of air slits through which heat generated in the display module is dissipated. The front casing includes an insulator preventing the heat generated in the display module from being transferred to the exterior of the front casing.

According to an aspect of the present invention, the insulator forms an air space insulating an upper side of the front casing from the display module.

According to an aspect of the present invention, the front casing is attached to the rear casing with a screw, and the front casing is provided with an attachment boss with which the screw is coupled without passing, and the rear casing is provided with a through hole, through which the screw passes.

According to an aspect of the present invention, the insulator forms the air space insulating lateral sides of the front casing from the display module.

According to an aspect of the present invention, the front casing is made of material containing aluminum.

According to another aspect of the present invention, a display apparatus, having a display module to display a picture includes a front casing, an insulator to prevent the heat generated in the display module from being transferred to the exterior, and a filter support, in a front thereof. An optical filter is in front of the filter support, to shield EMI. A decorative member is in front of the optical filter and supports the optical filter by being attached to the front casing. A rear casing is attached to the rear of the front casing to conduct EMI away from the front casing.

According to an aspect of the present invention, the decorative member is attached to the front casing with a screw.

According to an aspect of the present invention, the decorative member is nonconductive.

According to an aspect of the present invention, the decorative member is made of material containing synthetic resin.

According to an aspect of the present invention, the front casing is made of material containing aluminum.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
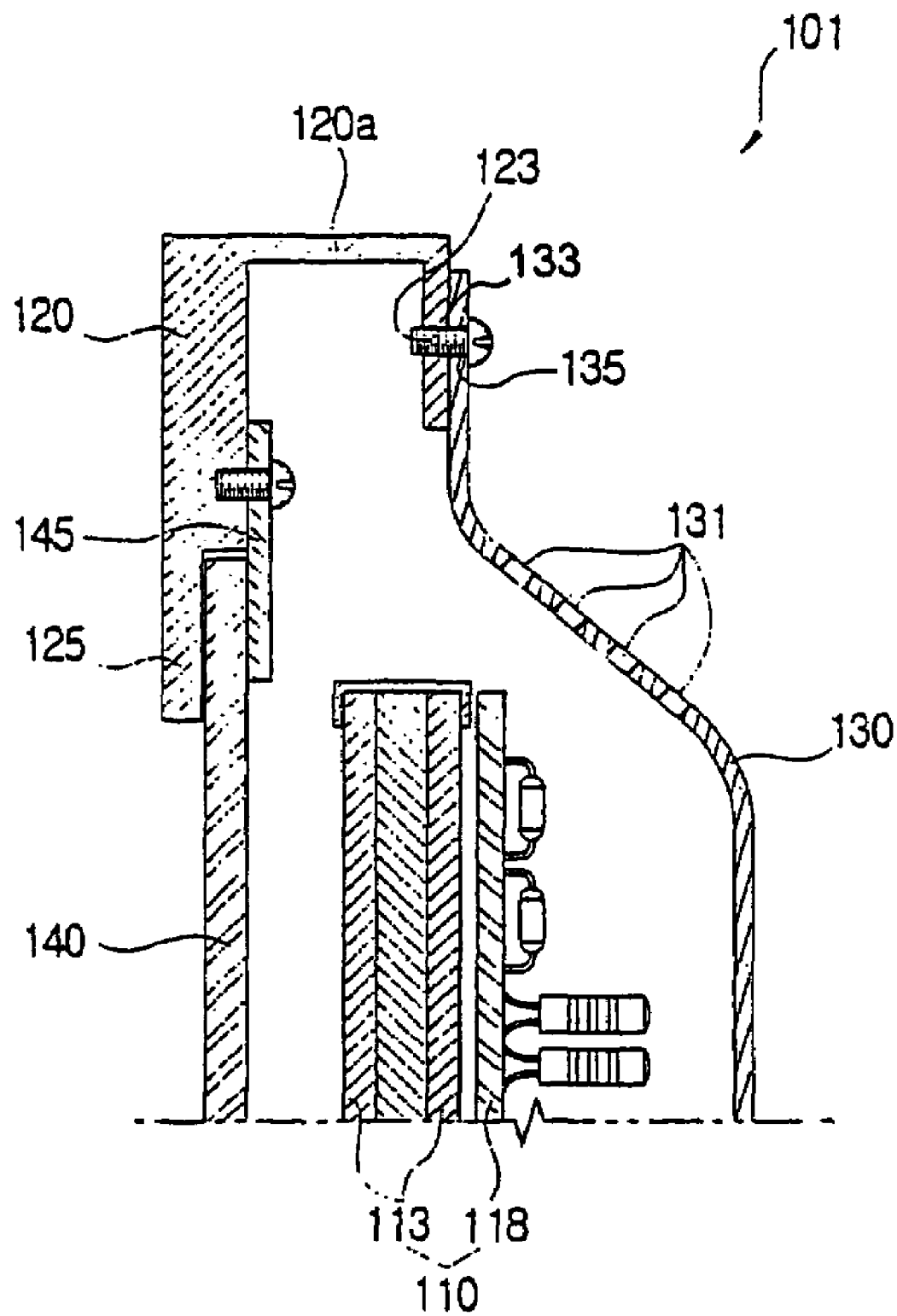
FIGS. 1 and 2 are partial sectional views of a conventional display apparatus.
Figure 2:
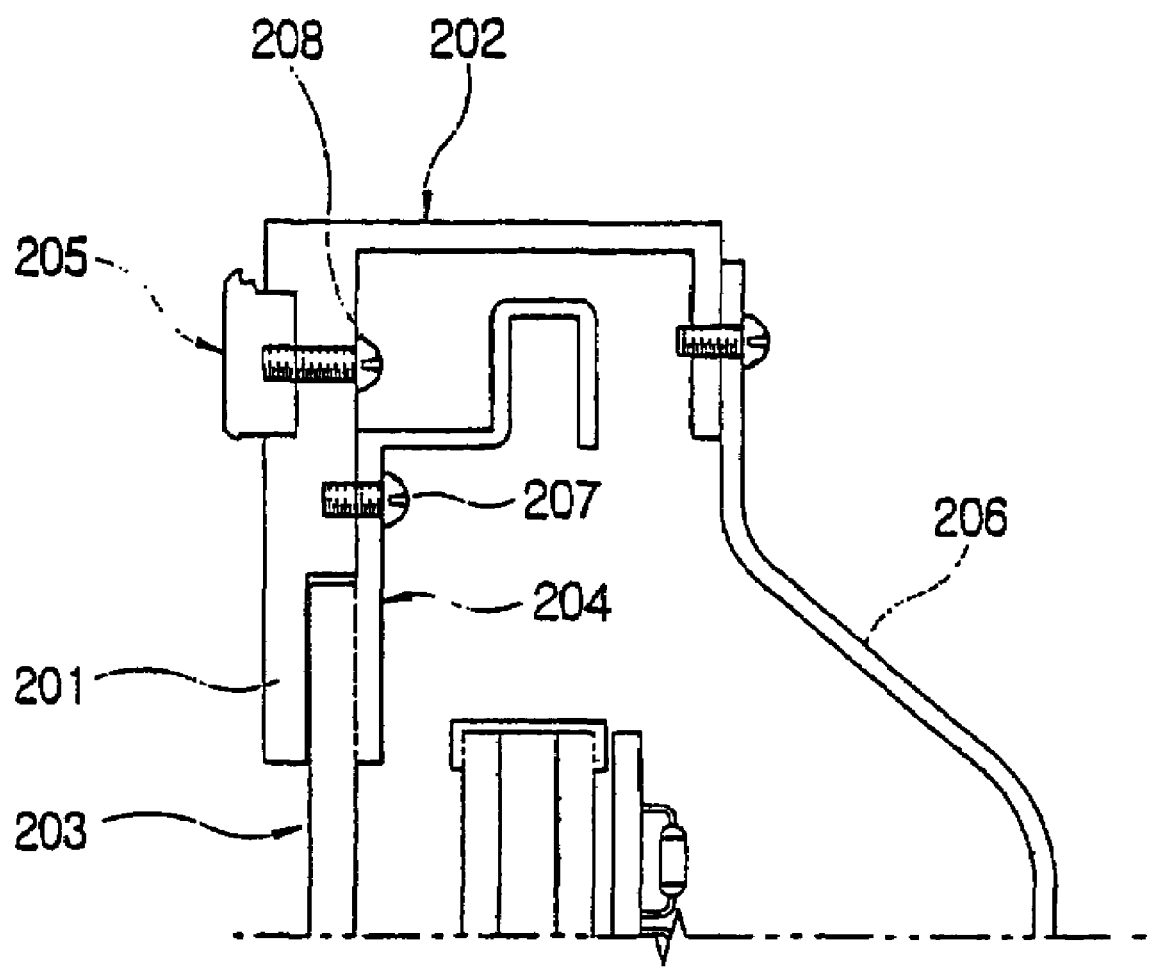

Reference will now be made in detail to the embodiments of the present invention, examples of which are illustrated in the accompanying drawings, wherein like reference numerals refer to like elements throughout. The embodiments are described below in order to explain the present invention by referring to the figures.

A display apparatus according to an aspect of the present invention displays a picture by using a CRT (Cathode Ray Tube), an LCD (Liquid Crystal Display), or a PDP (Plasma Display Panel), etc.

Hereinafter, the display apparatus including the PDP will be described in conjunction with the accompanying drawings.

Figure 3:
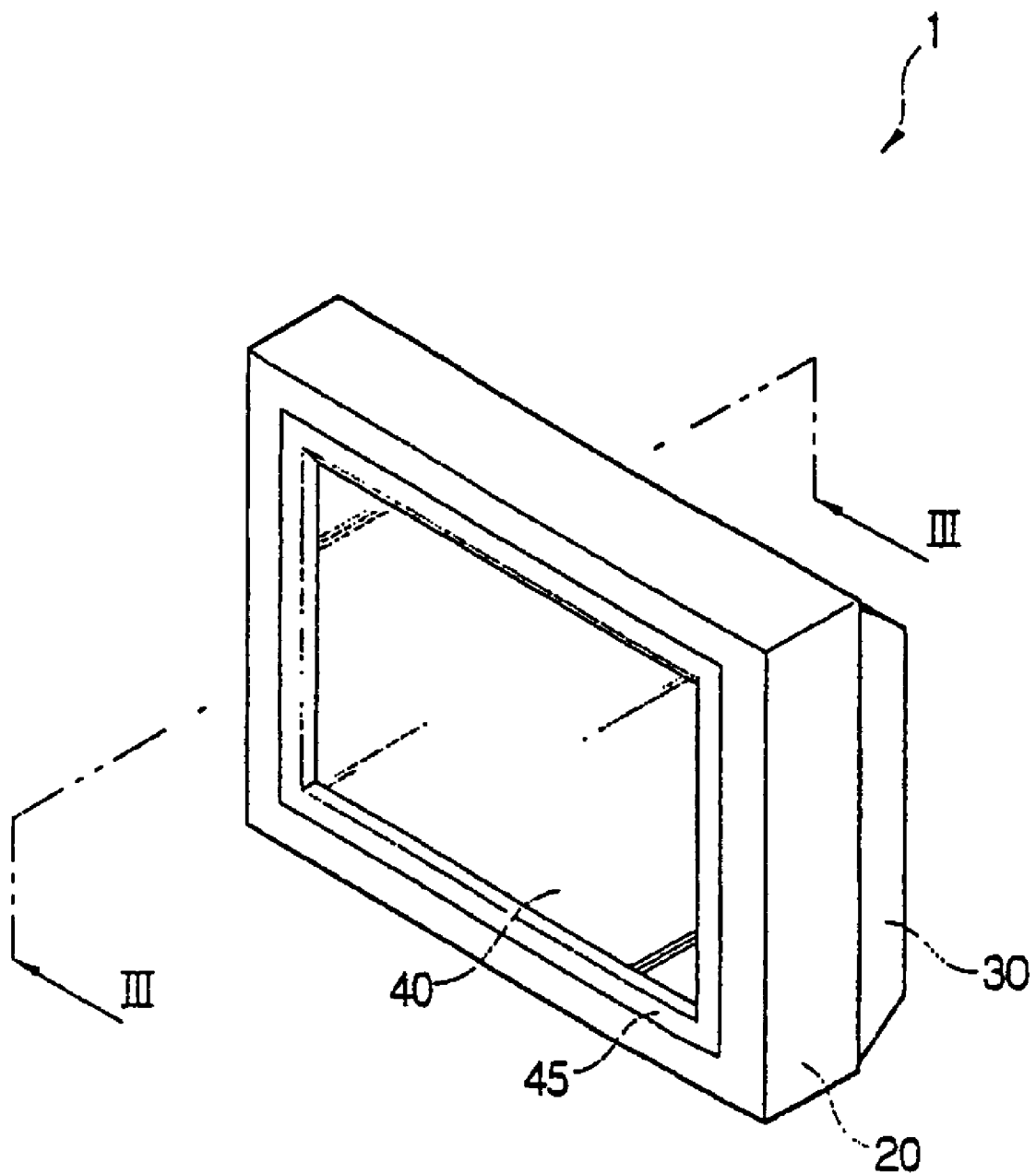
FIG. 3 is a perspective view of a display apparatus according to an aspect of the present invention.
Figure 4:
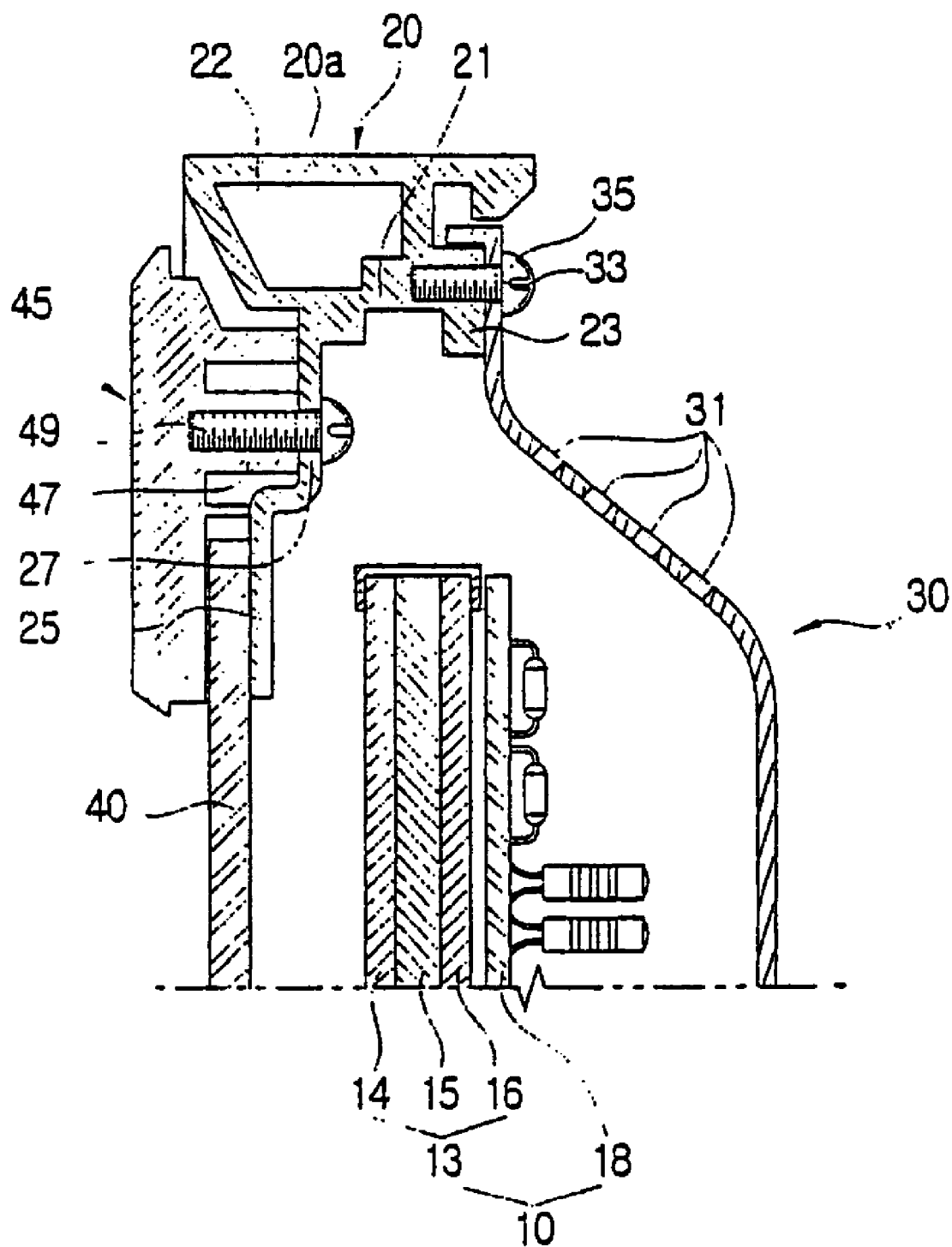
FIG. 4 is a partial sectional view of the display apparatus, taken along line III-III shown in FIG. 3.
Figure 5:
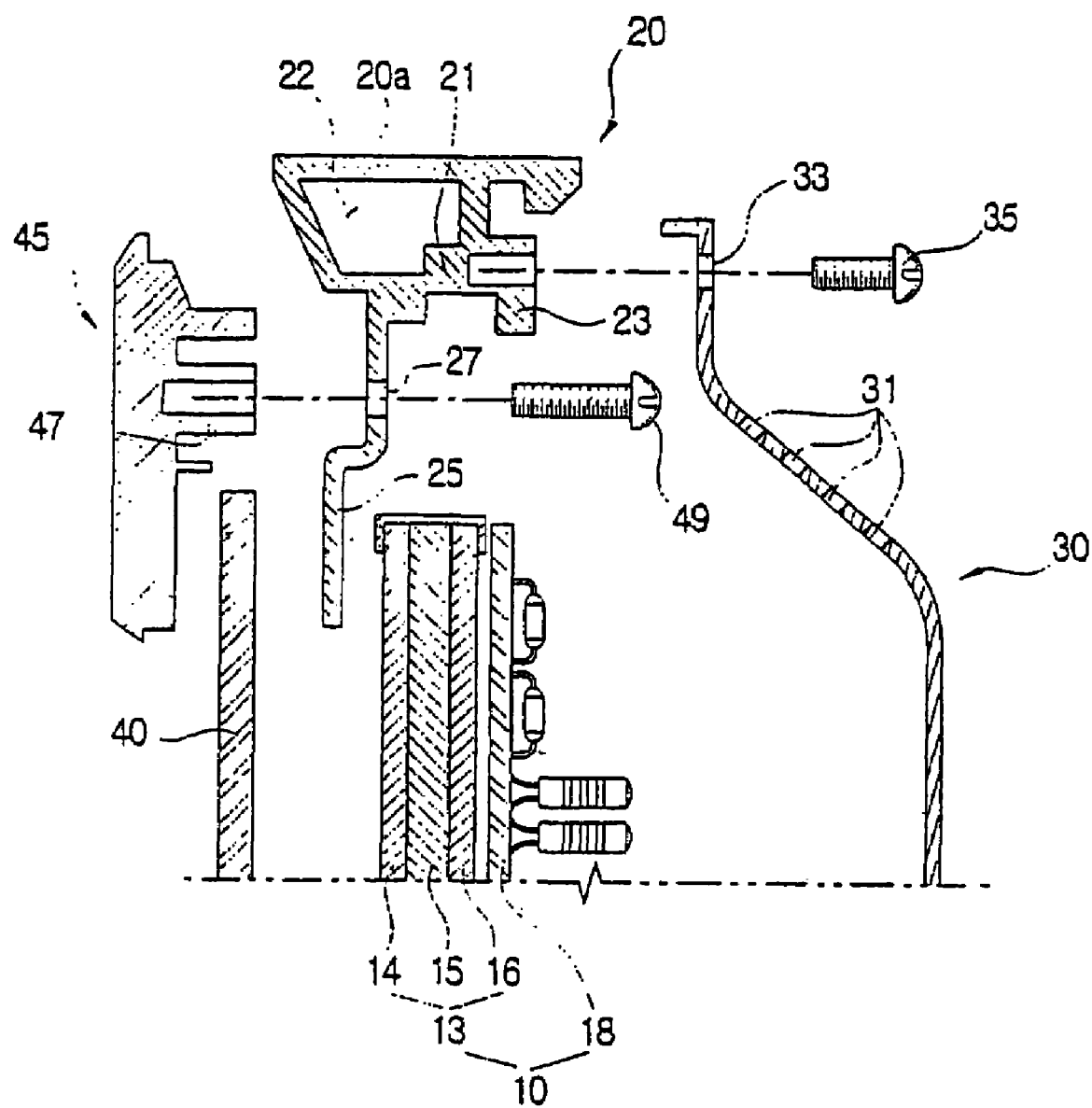
FIG. 5 is an exploded sectional view of the display apparatus of FIG. 4.

As shown in FIGS. 3 through 5, the display apparatus 1, according to an aspect of the present invention includes a display module 10, to display a picture, a front casing 20 adjacent to a front and sides of the display module 10, and a rear casing 30 provided to the rear of the display module 10.

The display module 10 includes a PDP 13, to display a picture, and a circuit board 18, to drive the PDP 13. Further, an optical filter 40 is in front of the display module 10.

The PDP 13 includes a front substrate 14, and a rear plate 16 spaced from the front substrate 14, to form a plasma discharging space 15. The PDP 13 is driven to display a picture, by the circuit board 18 that is to the rear of the PDP 13. Both the PDP 13 and the circuit board 18 generate significant heat while operating.

The optical filter 40 is in front of the PDP 13, thereby protecting the PDP 13 and filtering a picture displayed on the PDP 13. Further, the optical filter 40 is supported by a filter support 25 (to be described later) of the front casing 20 and a decorative support member 45 (to be described later) in the front of the front casing 20. Further, the optical filter 40 is a glass substrate coated with a conductive film made of material having high conductivity, and is grounded to the rear casing 30 through the filter support 25 of the front casing 20. That is, the optical filter 40 filters the EMI generated in the display module 10 before the EMI exits the front of the display module reaching a user. The EMI is conducted to the rear casing 30 through the front casing 20 due to contact with the conductive film. The optical filter 40 may have various configurations as required.

The decorative support member 45 has a fastener 47 corresponding to an attachment hole 27 (to be described later) in the front casing 20 so as to allow attachment to the front casing 20 with a second screw 49. Further, the decorative support member 45 is attached to the front of the front casing 20, thereby improving outer appearance and, together with the front casing 20, supporting the optical filter 40. That is, the decorative support member 45 is employed for both decorating the display apparatus and supporting the optical filter 40.

The front casing 20 includes an insulator 21, to prevent the heat generated in the display module 10 from being transferred to the exterior of the front casing 20. Further, the front casing 20 includes an attachment boss 23, to which a first screw 35 is inserted, so as to attach the front casing 20 to the rear casing 30 and the filter support 25, contacting a rear edge of the optical filter 40 and supporting the optical filter 40. According to an aspect of the present invention, the front casing 20 is made of material containing aluminum.

The attachment boss 23 allows the first screw 35, inserted through the rear casing 30, not to pass therethrough, but to be coupled therein.

The rear casing 30 has a plurality of air slits 31, to dissipate the heat generated in the display module 10. Further, the rear casing 30 has a through hole 33, through which the first screw 35 is passed, corresponding to the attachment boss 23 of the front casing 20. The rear casing 30 is made of material having sufficient conductivity to conduct the EMI from the front casing 20.

The insulator 21 forms an air space 22 allowing an upper side 20a of the front casing 20 to be insulated from the display module 10. That is, the insulator 21 is placed between the upper side 20a of the front casing 20 and the display module 10, thereby forming the air space 22, to insulate the upper side 20a of the front casing 20 from the display module 10. Thus, air heated by the heat generated in the display module 10 is prevented, by the insulator 21, from directly contacting the upper side 20a of the front casing 20. Further, heat transfer is prevented by the air space 22, thereby preventing the upper side 20a of the front casing 20 from being heated by the air heated by the display module 10.

According to an aspect of the present invention, the display apparatus 1 is assembled as follows.

First, the display module 10 is attached to either the front casing 20 or the rear casing 30. Further, the optical filter 40 is positioned on the filter support 25 of the front casing 20, and then the edge of the optical filter is supported by the decorative support member 45 with the second screw 49.

Further, the rear casing 30 is attached to the front casing 20 with the first screw 35. The first screw 35 is coupled to the attachment boss 23 of the front casing 20 without passing therethrough, so that any debris created between the attachment boss 23 and the first screw 35 is prevented from falling toward the display module 10, thereby preventing the display module 10 from experiencing a malfunction due to the fallen debris.

Thus, assembly of the display apparatus 1 is simplified. When such an assembled display apparatus 1 is operated, air near the display module 10 is heated during operation, and the heated air rises and is dissipated through the air slits 31 of the rear casing 30. Further, any high temperature air that is not dissipated remains in an upper part of the front casing 20, but does not directly contact the upper side 20a of the front casing 20 because of the insulator 21 provided in the front casing 20. Thus, heating of the upper side 20a of the front casing 20 is prevented.

Further, the decorative support member 45 not only improves the outer appearance of the display apparatus, but also supports the optical filter 40 without requiring a filter bracket as used in a conventional apparatus. Therefore, the number of components and the number of assembling processes are relatively decreased, and consequently economize the manufacturing process.

In the above-described aspects of the present invention, the insulator 21 is provided in the upper part of the front casing 20. However, the insulating part may alternatively be positioned opposite lateral parts of the front casing so as to form air spaces, to insulate opposing lateral sides of the front casing from the display module.

In the above-described aspects of the present invention, the front casing 20 is made of material containing aluminum. However, the front casing may alternatively be made of a plastic material or other metallic materials.

As described above, an aspect of the present invention provides a display apparatus to prevent heat from being transferred from a display module to the exterior of a front casing.

Further, an aspect of the present invention provides a display apparatus in which debris created upon insertion of a screw does not fall toward the display module, thereby preventing a malfunction of the display module due to fallen debris.

Still further, an aspect of the present invention provides a display apparatus in which a decorative support member both improves an outer appearance and supports an optical filter, so that the number of components is decreased and assembling efficiency is enhanced.

Although a few embodiments of the present invention have been shown and described, it will be appreciated by those skilled in the art that changes may be made in these embodiments without departing from the principles and spirit of the invention, the scope of which is defined in the claims and their equivalents.

What is claimed is:

1. A display apparatus for a display module, comprising:
   a filter to filter electromagnetic interference (EMI) generated by the display module;
   a front casing including an attachment boss and an insulator, to cover a front of a display module and to support the filter; and
   a rear casing attachable with fasteners to the front casing, to cover a rear of the display module,
   wherein any debris resulting from attachment of the front casing to the rear casing is retained within the attachment boss, and
   the insulator is a first wall of the front casing separated by an air space from a second wall of the front casing, to prevent heat generated by the display module from heating an exterior of the display apparatus.

2. The display apparatus according to claim 1, wherein the insulator is at least one of above the display module and laterally opposite sides of the display module.

3. The display apparatus according to claim 1, wherein the rear casing includes a plurality of slits, to dissipate heat generated by the display module to a rear of the display apparatus.

4. The display apparatus according to claim 1, wherein the filter, the front casing and the rear casing are conductive, and the rear casing is grounded, to conduct the EMI to the rear of the display module.

* * * * *